United States Patent [19]

Patterson, III

[11] 4,282,515

[45] Aug. 4, 1981

[54] ANALOG TO DIGITAL ENCODING SYSTEM WITH AN ENCODER STRUCTURE INCORPORATING INSTRUMENTATION AMPLIFIER, SAMPLE AND HOLD, OFFSET CORRECTION AND GAIN CORRECTION FUNCTIONS

[75] Inventor: Raymond B. Patterson, III, Melbourne, Fla.

[73] Assignee: Harris Corporation, Melbourne, Fla.

[21] Appl. No.: 59,422

[22] Filed: Jul. 20, 1979

[51] Int. Cl.³ .......................................... H03K 13/02
[52] U.S. Cl. ............................ 340/347 CC; 328/151;
    307/352; 340/347 M; 340/347 AD; 340/347 SH
[58] Field of Search ..... 340/347 M, 347 CC, 347 SH,
    340/347 AD; 324/99 D; 73/362 AR; 328/151;
    330/124 R; 307/352

[56] References Cited

U.S. PATENT DOCUMENTS

| | | | |
|---|---|---|---|
| 3,027,079 | 3/1962 | Fletcher et al. | 340/347 M X |
| 3,530,458 | 9/1970 | Willard et al. | 340/347 CC |
| 3,943,506 | 3/1976 | Peattie | 340/347 NT |
| 3,982,241 | 9/1976 | Lipcon | 340/347 CC |

OTHER PUBLICATIONS

Schmid, Electronic Analog/Digital Conversions, Van Nostrand Reinhold Co., 1970, pp. 387–389.

Primary Examiner—Thomas J. Sloyan
Attorney, Agent, or Firm—Leitner, Palan, Martin & Bernstein

[57] ABSTRACT

A new encoder for an analog to digital converter of the successive approximation type incorporates instrumentation amplifier and signal sample and hold functions within the encoder proper, thereby substantially simplifying the converter circuitry. An input analog current signal is applied to a sample and hold capacitor within the encoder through the encoder comparator at a time when the weighted reference signal to the comparator is set to zero. The capacitor stored analog voltage is subsequently applied to the encoder summing node and the encoding sequence ensues. The encoder may be provided with offset and gain correction circuitry, conventionally found exterior to the encoder. In one embodiment of the invention, offset correction is effected using the signal sample and hold capacitor.

6 Claims, 6 Drawing Figures

ANALOG TO DIGITAL ENCODING SYSTEM WITH AN ENCODER STRUCTURE INCORPORATING INSTRUMENTATION AMPLIFIER, SAMPLE AND HOLD, OFFSET CORRECTION AND GAIN CORRECTION FUNCTIONS

BACKGROUND OF THE INVENTION

Analog to digital converters, and particularly that class of converters known as the successive approximation type, are typically comprised of a preamplifier stage, often termed the instrumentation amplifier, a sample and hold circuit, and an encoder.

The instrumentation amplifier functions to condition the analog input signal to be compatible with the encoder wherein it is converted to digital form. In most data acquisition systems in common use today, the system multiplexer produces a double ended or differential output voltage. The encoder responds to a signal ended signal and thus signal conversion is necessary. The instrumentation amplifier operates to provide differential to signal ended signal conversion, as well as common mode signal rejection with whatever voltage gain is needed to provide a single ended output voltage range that is compatible with the sample and hold and encoder circuitry which follow in that order.

Typically, an instrumentation amplifier consists of an input transconductance amplifier and an output transimpedance amplifier. The transconductance amplifier converts a difference in voltage at its two inputs into a current at its output. Voltages common to both inputs do not produce an output current. Thus, the transconductance amplifier rejects voltages common to both its input terminals. Its output current is then fed into the transimpedance amplifier, which is referenced to the data acquisition system ground, to convert it back into an output voltage. Since this output voltage is referenced to the data acquisition system ground, it is called single-ended. The voltage gain of the instrumentation amplifier is set by the product of the input stage transconductance and the output stage transimpedance. The gain may be altered by changing the transconductance, the transimpedance, or both.

The voltage out of the instrumentation amplifier is sampled at a defined time by the sample and hold circuit and held as a fixed DC voltage at its output while the encoder converts it into a digital signal. A typical sample and hold circuit consists of an input buffer amplifier, an electronic switch, a holding capacitor and an output buffer amplifier. The input buffer amplifier may be omitted if the transimpedance stage of the instrumentation amplifier can withstand the transient produced by the electronic switch and hold capacitor combination.

The output voltage from the sample and hold circuit is applied to the encoder input. A typical encoder of the successive approximation type consists of an input stage, a decoder, a comparator, a latch, sequential logic, and a voltage reference. The input stage may be a precision resistor or may be a buffer amplifier driving a precision resistor. The decoder is a digital to analog converter. The latch operates to store the binary output state of the comparator while the sequential logic operates to generate digital input to the decoder. The voltage reference functions to set the digital to analog conversion range of the decoder. The operation of the encoder generally follows the following sequence. The input stage converts the sample and hold output voltage into a current which is compared against a current generated by the decoder. The currents are compared at a node called the summing node or summing bus. The comparator output is a digital signal which is queried and stored in the latch, after allowing time for the comparator to settle. The output from the latch is fed to the sequential logic and tells it whether the decoder output current is larger than the signal current. If it is, the last digit to be entered into the decoder, is switched back to a zero and the next smaller digit is entered. If it is not, the last digit to be entered is kept, and the next smaller digit is entered. After allowing it time to settle again, the comparator is queried, and its decision stored in the latch, and so on, repetitively, until the least significant digit has been compared to end the decoding process.

It is known that analog to digital converters experience offset and gain errors. Offset error is defined as a translation error. This means that it is a constant error regardless of signal magnitude. Gain error is defined as a slope error. This means that it is a linear function of signal magnitude. In that offset error and gain error are two separate and distinct entities, they must be individually correct.

In conventional analog to digital converters using a separate instrumentation amplifier and a separate sample and hold circuit distinct from the encoder circuit, offset error is generally corrected only at the instrumentation amplifier. This is accomplished during an offset correction period of an encoding cycle by tying the differential voltage signal inputs of the instrumentation amplifier together, and/or ground, and driving the output to zero by means of a separate offset correction sample and hold amplifier whose inputs tie to system ground and the instrumentation amplifier output, and whose output is a bias current change in the front end of the transconductance stage of the instrumentation stage of the amplifier. During the zeroing operation, the sample switch of the correction sample and hold circuit is closed. When it is opened, the offset correction is held while the inputs to the instrumentation amplifier are tied to the signal source through the multiplexer of the data acquisition system. This scheme leaves the output of the instrumentation amplifier offset by an amount equal to the offset of the correction sample and hold circuit.

The technique just described is but one of the known techniques which make use of the instrumentation amplifier for offset correction. It is also known to provide offset correction with respect to the encoder alone or the encoder and sample and hold circuit together. Such known offset correction schemes employ a correction loop around the encoder or around the encoder and sample and hold circuits together. Such correction loops may employ correction circuits such as the one discussed with respect to the instrumentation amplifier offset correction circuit or they may employ digital correction and storage in the encoder itself.

Gain correction is not often done in the analog portion of the data acquisition system. The more common practice is to apply a standard signal to one multiplexer channel, encode it, take the digital difference between what is encoded and what would have been, and in the digital processor part of the system, calculate a multiplication factor from this difference. This multiplication factor is then used to multiply the succeeding channel codes.

For a more complete understanding of the state of the prior art, reference is made to FIGS. 1 and 2. FIG. 1 illustrates a conventional analog to digital converter forming a part of a data acquisition system. FIG. 2 illustrates specific circuitry which might be used to implement the functional blocks of FIG. 1. The instrumentation amplifier, sample and hold circuit, and encoder of FIG. 1 are constructed as distinct circuits and are produced as separate modules, printed circuit boards or integrated circuits.

The input switches 10 include input signal switches $S_V$ and $S'_V$ as well as system ground switches $S_G$ and $S'_G$. Thus, the differential input signal from the multiplexer portion of the data acquisition system is applied to the input of the transconductance amplifier 12 through the signal switches $S_V$ and $S'_V$. At certain times during the conversion sequence, such as during offset correction, it is necessary for the inputs to the transconductance amplifier to be tied to the data acquisition system ground. Switches $S_G$ and $S'_G$ provide this ability.

The transconductance amplifier 12 as illustrated in FIG. 2 is but one of several such amplifiers which may be used with the analog to digital converter. The illustrated transconductance amplifier includes differential amplifiers 46, 48 which receive the differential input signal from the system multiplexer. The transconductance amplifier further includes current sources 40 and 42, current mirror 44, and current mirrors 50 and 52. The transconductance amplifier gain is given by the reciprocal of the value of the resistance $R_{G1}$. The value of the resistance $R_{G1}$ can be switched to change the voltage range at the input.

The purpose of the current mirrors 44, 50 and 52 in the transconductance amplifier is to permit the differential input to single ended output conversion with common mode signal voltage rejection. The output from the transconductance amplifier is taken at a node 56. Thus, the amplifier 12 operates as a voltage to current converter to thereby supply a single ended current signal proportional to the differential input voltage at the node 56. This current is supplied to the transimpedance amplifier 14.

The transimpedance amplifier may comprise a differential amplifier A1 with feedback resistance $R_2$. The value of the resistance $R_2$ determines the gain of the transimpedance amplifier 14. The transimpedance amplifier operates as a current to voltage converter to produce the required voltage signal to the input of the signal sample and hold circuit 18.

The signal sample and hold circuit stores the voltage at the output of the transimpedance amplifier 14 on its holding capacitor $C_1$ when the sample switch $S_S$ closes and holds this voltage after the switch opens. This voltage is transferred through a unity gain buffer amplifier $A_2$ to the transconductance stage 24 of the encoder. The transconductance stage illustrated in FIG. 2, is simply a resistor $R_{G2}$ whose output end ties to the summing node 25 of the encoder. The summing node is maintained at virtual ground and is held at ground potential by negative feedback through the nonlinear network 58 comprised of two anode to cathode parallel connected diodes. The output of the transconductance stage is thus the current equal to the signal sample and hold voltage times the reciprocal of the value of the resistance $R_{G2}$.

In normal operation, the current flowing into the summing node 25 is successively compared against current generated by the decoder 26 which flows out of the summing node during the encoding process.

Mention has not yet been made of offset correction as implemented in the prior art circuits of FIGS. 1 and 2.

In the conventional analog to digital converter system of the type being discussed, offset correction is oftentimes provided for in the instrumentation amplifier alone. It is accomplished by means of a sample and hold circuit 16 which feeds back around the transimpedance amplifier. During the correction portion of the encoding cycle, the input switches tie both inputs to the transconductance amplifier to system ground. That is, during the offset correction sequence of the operating cycle, switches $S_V$ and $S'_V$ are open while switches $S_G$ and $S'_G$ are closed. This sequencing of the switches is illustrated in the switch timing diagram of FIG. 5. As a result, any offsets in the transconductance amplifier 12 produce an output current at the inverting input to the transimpedance amplifier 14. The product of this current and the resistance $R_2$ produces a voltage at the output of the transimpedance amplifier. During the offset correction sequence, the switch S2 of the amplifier A3 is open while switches 21 and S3 are closed to close the correction loop. The offset correctional operational amplifier A3 then drives the holding capacitor C2 through the switch S3 to a voltage that will permit the MOSFET buffer stage 54 to sink offset current, thereby forcing the output of the transimpedance amplifier 14 to zero. Switches S1 and S3 are then opened, leaving the correction signal stored as a voltage across the capacitor C2. The switch S2 is closed to keep the amplifier A3 from running into stops and saturating some bipolar device which would cause an unnecessarily long recovery time. The switching sequence for switches S1, S2, and S3 are illustrated in the switch timing diagram of FIG. 5.

In operation of the analog to digital converter system of FIGS. 1 and 2, signal sample and hold occurs after offset correction during an operating cycle. Following the sampling and holding on capacitor C1 of the voltage proportional to the differential input voltage, the encoding sequence begins. The encoding sequence is conventional and well known to those skilled in the art.

It should now become apparent from the preceding discussion that the input signal to be converted to digital form has twice been converted from a voltage to a current, once in the instrumentation amplifier, and once in the encoder. It would indeed be advantageous if this duplication could be eliminated while substantially simplifying the circuitry of the analog to digital converter.

SUMMARY OF THE INVENTION

It is an object of the invention to produce an analog to digital converter using integrated circuit techniques and wherein the encoder incorporates the sample and hold function of the sample and hold circuit of the prior art converter as well as substantial portions of the instrumentation amplifier.

It is a further object of this invention to produce an integrated circuit type analog to digital converter for receiving differential voltage inputs and supplying a single ended current proportional to the differential analog input voltage through a single voltage-current conversion step.

It is a still further object of this invention to produce an analog to digital converter whose encoder can function to generate and store offset correction and gain correction information.

These and other objects, as will become apparent from a reading of the detailed description of the preferred embodiments of the invention set out hereinafter, are realized by the unique encoder construction described in detail hereinafter. The encoder structure incorporates the required instrumentation amplifier and sample and hold functions of the analog to digital converter as well as offset and gain correction. Both offset and gain corrections are for the entire system and do not compensate solely for offset and gain correction in any particular portions of the analog to digital converter system.

The new encoder configuration comprises the usual comparator, decoder (digital to analog converter), and successive approximation logic all implemented on a single module or integrated circuit. As with the standard converter system, input differential signals are applied to input switches for selected application to a transconductance amplifier functioning to convert the double ended input signal into a single ended signal compatible with the encoder. The analog to digital converter system of the present invention does not include a transimpedance amplifier nor does it include a discrete sample and hold circuit. The elimination of the transimpedance amplifier is made possible by the unique encoder design which eliminates the need for the double voltage to current conversion, thus significantly reducing circuit complexity. This result is achieved by designing the sample and hold circuit within the encoder at a point downstream of the comparator. As will be explained in greater detail hereinafter, the sample and hold circuit is located at the comparator output and is selectively, electronically, connected to the output of the comparator through the switches. The comparator of the encoder, which is generally a differential amplifier, is modified from its conventional configuration to include a switch in its feedback path permitting removal of the nonlinear feedback during the signal sampling period. The analog signal, in the form of an analog current, is supplied to the encoder summing node or bus. The summing node is connected to one input of the comparator differential amplifier with its other input being connected to system ground. With the non-linear feedback path open, and the sample and hold circuit switch closed, the comparator output charges the sample and hold capacitor to a voltage proportional to the unknown input analog current.

The encoder sample and hold circuit includes a transconductance device to convert the stored analog voltage to a current. This transconductance device is connected back to the summing node and serves as the input to the encoder comparator during the encoding period.

Further features of the invention involve the ability of the novel encoder to effect both offset and gain correction. In one embodiment of the invention, the signal sample and hold circuit serves the added purpose of an offset correction circuit during an offset correction period of the entire encoding cycle. The gain correction circuitry is also included in the encoder module. With offset and gain correction circuitry forming a portion of the encoder proper, offset and gain correction is realized for the entire analog system (except the multiplexer of the data acquisition system).

DETAILED DESCRIPTION OF THE PREFERRED EMBODIMENT

As explained hereinbefore, conventional analog to digital converter systems forming a portion of a data acquisition system are comprised of a plurality of separate, distinct circuits produced as separate modules, printed circuit boards or integrated circuits. The primary circuits are the instrumentation amplifier, the sample and hold circuit and the encoder. The instrumentation amplifier operates to convert a double ended analog signal from a multiplexer of a data acquisition system to a single ended analog voltage for application to the signal sample and hold circuit forming a second discrete circuit. The double to single ended conversion involves first a voltage to current conversion in a transconductance amplifier, then a current to voltage conversion in a transimpedance amplifier. The stored analog voltage is supplied to the encoder input during the encoding period of the encoding cycle. The encoder is current responsive. That is, it must receive the input analog signal which is to undergo conversion into digital form as a current at its summing node. In practice, the summing node also receives a balance current from a decoder section of the encoder, which balance current is of opposite sense to the input analog current. This balance current is represented in the decoder as a digital signal. When the balance current is equal in magnitude to the input current, a signal is generated to indicate that the digital signal corresponding to the balance current at that time also represents the input signal. From the foregoing it becomes apparent that the voltage stored in the sample and hold circuit must be converted back into a current before application to the encoder summing node. A second transconductance amplifier forming a portion of the encoder circuit is used for this purpose.

System complexity is reduced along with cost while reliability is increased by the unique encoder design which incorporates on a single circuit module, printed circuit board or integrated circuit all the functions of the instrumentation amplifier circuit and the sample and hold circuit. Such an encoder has been briefly described hereinbefore, and will now be discussed in detail with reference to FIGS. 3, 4 and 6.

Figure 3:
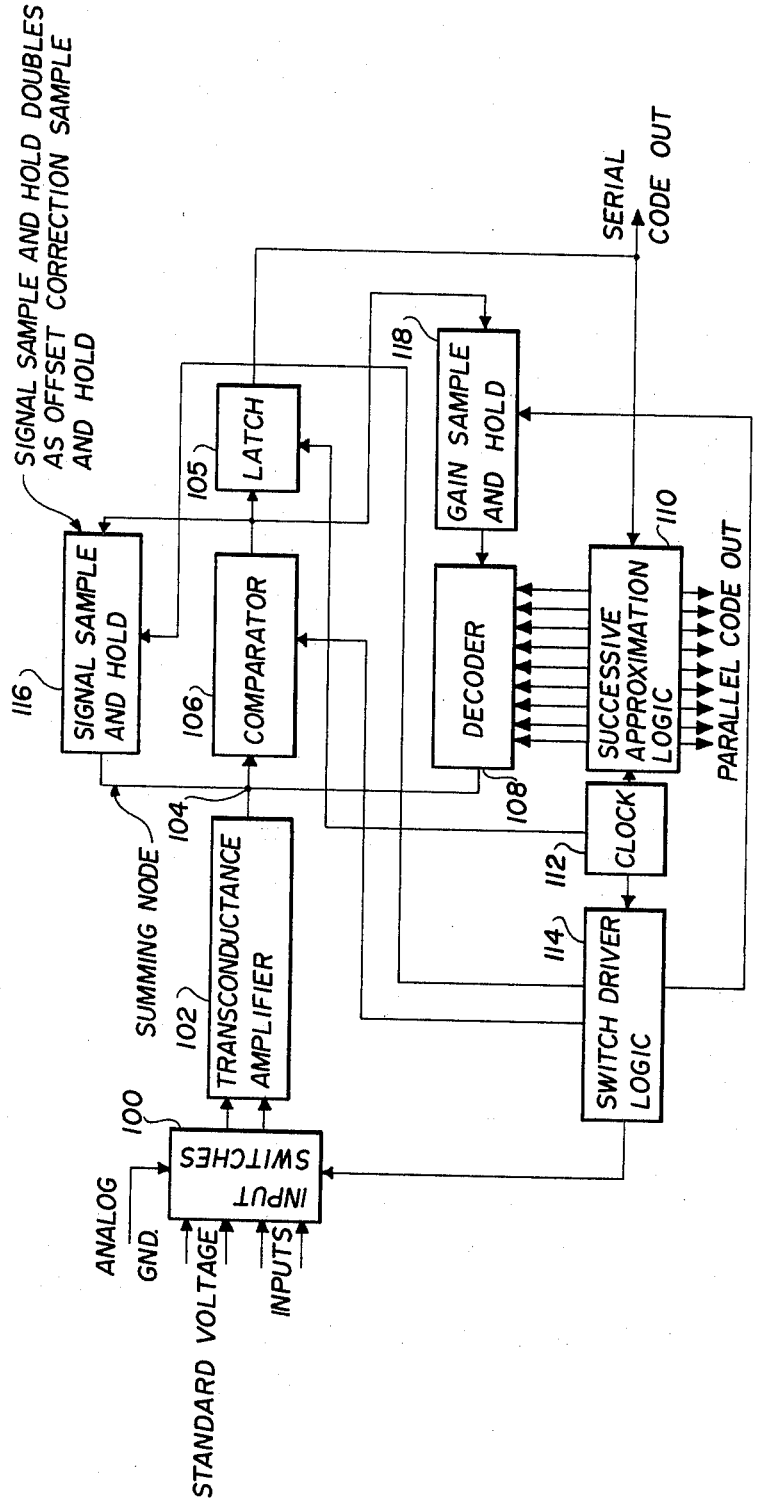
FIG. 3 is a block diagram of the analog to digital converter of the present invention including the novel encoder, the design of which permits the implementation of the inventive analog to digital converter.

The inventive encoder, which may be fabricated as a single integrated circuit, is comprised of input switches 100, transconductance amplifier 102, comparator 106, latch 105, decoder or digital to analog converter 108, successive approximation logic 110, clock 112, and switch driver 114. Except for the input switch 100, these functional blocks are generally considered as forming a portion of the conventional encoder section of the analog to digital converter system. The encoder of FIG. 3 is, in addition, provided with a sample and hold circuit 116 and a gain correction sample and hold circuit 118. In the FIG. 3 embodiment of the invention, the sample and hold circuits 116 double as an offset correction sample and hold circuit. Alternatively, a separate offset correction sample and hold circuit may be used.

Figure 4:
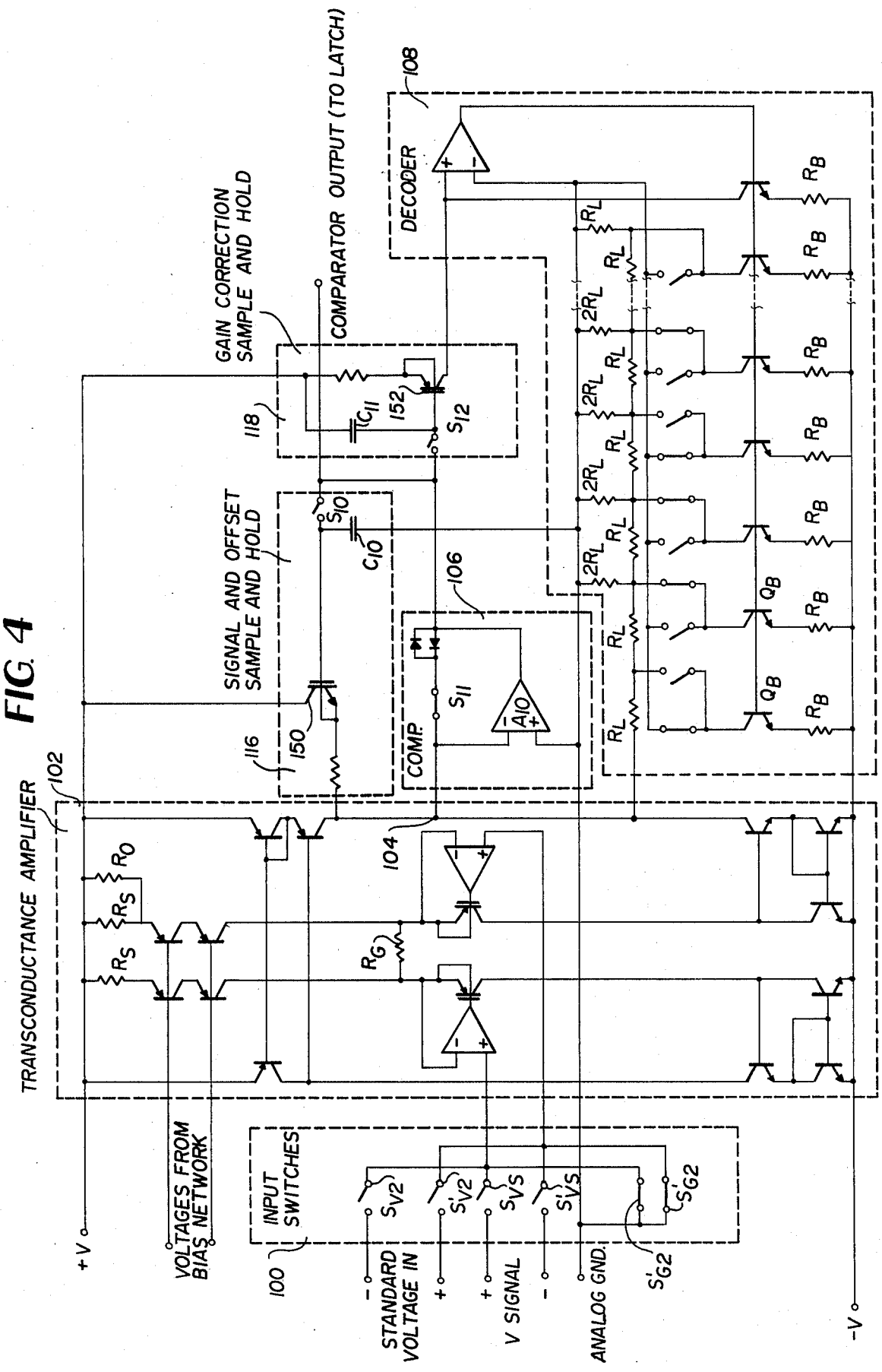
FIG. 4 illustrates detailed circuitry for implementing the new encoder design of the invention.
Figure 5:
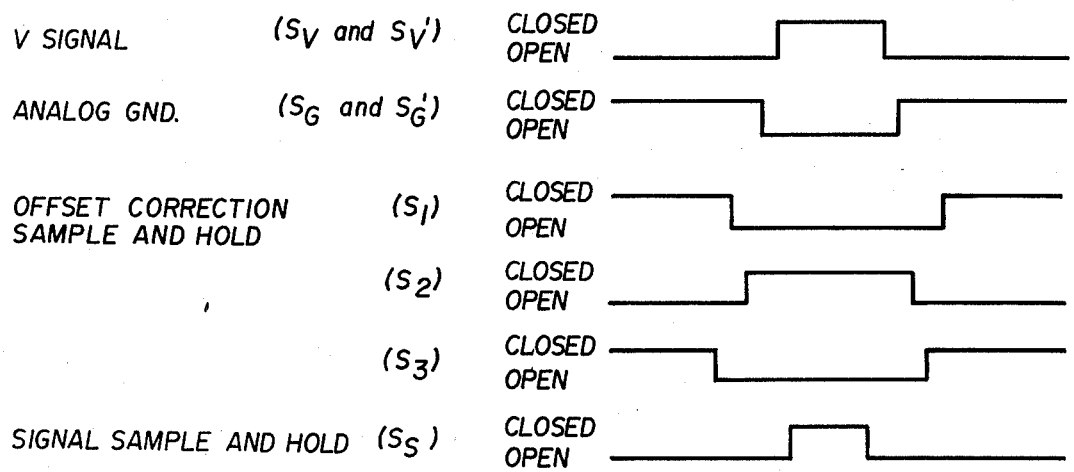
FIG. 5 is a switch timing diagram illustrating the opened and closed states of the various switches of the conventional analog to digital converter system of FIG. 1 as commanded by the switch driver logic.
Figure 6:
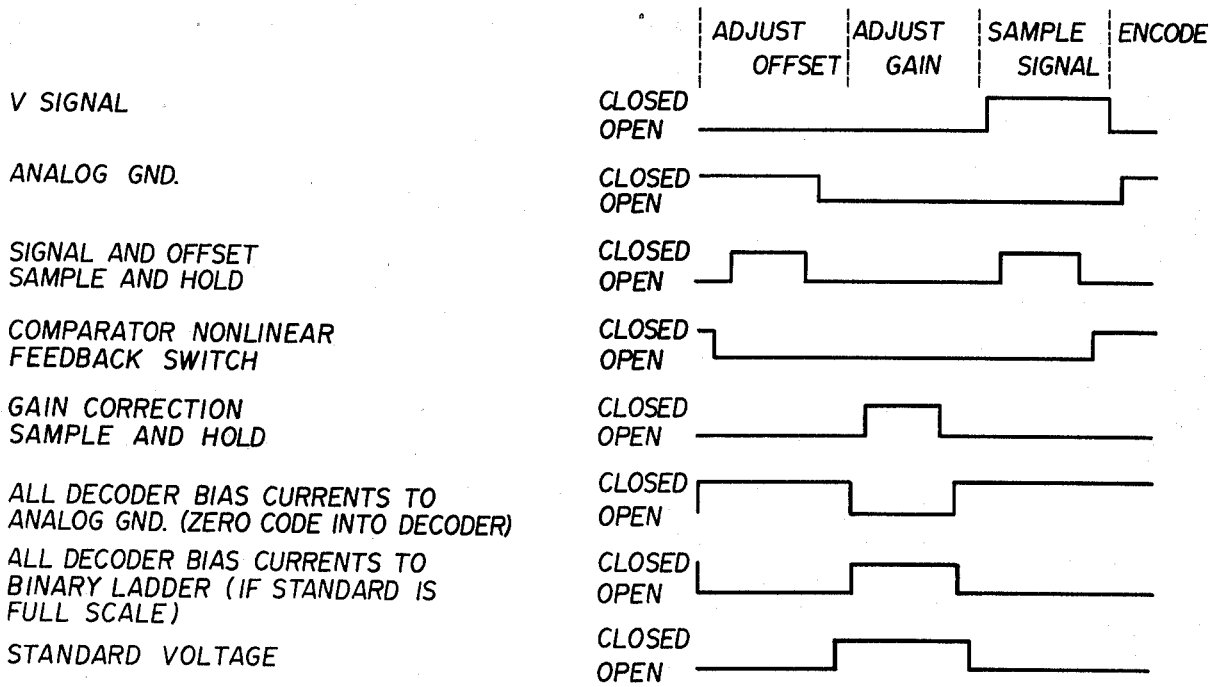
FIG. 6 is a switch timing diagram illustrating the opened and closed states of the various switches of the analog to digital converter system of the invention as illustrated in FIG. 3 and as commanded by the switch driver logic.

Suggested circuitry for implementing various of the functional blocks of FIG. 3 is illustrated in FIG. 4. The input switches 100, designated individually as $S_{VS}$, $S'_{VS}$, $S_{V2}$, $S'_{V2}$, $S_{G2}$, and $S'_{G2}$, while illustrate as mechanical switches, are preferably electronic switches, such as transistors, the on-off states of which are controlled by the switch driver logic 114. Indeed, although all switches are illustrated in FIG. 4 as mechanical switches, they are preferably electronic switches controlled by the switch driver logic. The states of the switches during the entire encoding operation or cycle which includes an offset correction sequence or period, gain correction period, signal sample and hold period, and an encoding period, is illustrated in FIG. 6.

The specific transconductance amplifier illustrated in FIG. 4 is illustrative only and not intended as a limiting factor of the invention and it is further to be understood that any of a variety of conventional transconductance amplifiers may be used. The illustrated transconductance amplifier 102 functions to convert a differential input voltage to a single ended current signal which can be inputted to the encoder summing node 104. The illustrated transconductance amplifier 102 operates in the same manner as the transconductance amplifier 12 of the instrumentation amplifier illustrated in FIGS. 1 and 2.

Figure 1:
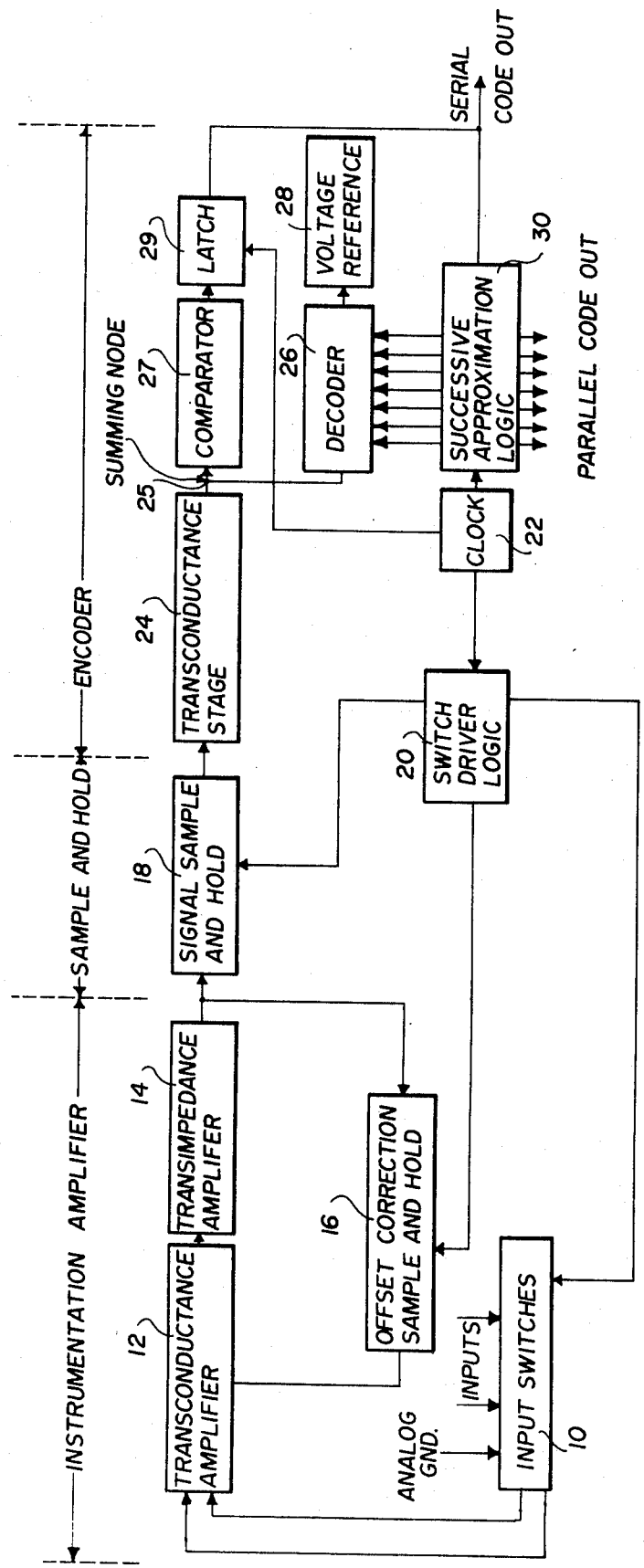
FIG. 1 is a block diagram of a conventional analog to digital converter system of the successive approximation type which forms a portion of a data acquisition system.

The comparator 106 is a modified form of the comparator 27 of the conventional encoder of FIG. 1. It is comprised of a differential amplifier A10, with a non-linear feedback path which includes two anode to cathode parallel connected diodes. The function of this non-linear feedback path is to hold the summing node at ground potential during the encoding period. The feedback path around the differential amplifier A10 also includes a switch $S_{11}$ operable to eliminate the non-linear feedback at all times of an encoding operation except during the encoding period itself. That is, switch $S_{11}$ is open during the offset and gain correction periods as well as during the sample and hold periods.

The sample and hold circuit 108 includes a sample and hold capacitor $C_{10}$, switch $S_{10}$, and transconductance device 150. The transconductance device 150 is illustrated as a MOSFET.

The gain correction sample and hold circuit 116 includes the capacitor $C_{11}$, switch $S_{12}$ and the transconductance device 152. During a gain correction period of an encoding cycle, the input switches 100 are operated to cause the inputs of the transconductance amplifier to be connected to a known, standard voltage. The decoder switches are all set to the one state or whatever code designates the standard voltage. The gain correction switch $S_{12}$ is then closed to cause the capacitor $C_{11}$ to charge, bringing the system to equilibrium. The gain correction switch $S_{12}$ is then opened, and the gain correction is stored as a voltage across the capacitor $C_{11}$. This voltage generates a current in the MOSFET buffer 152 which acts as the reference for the decoder.

Figure 2:
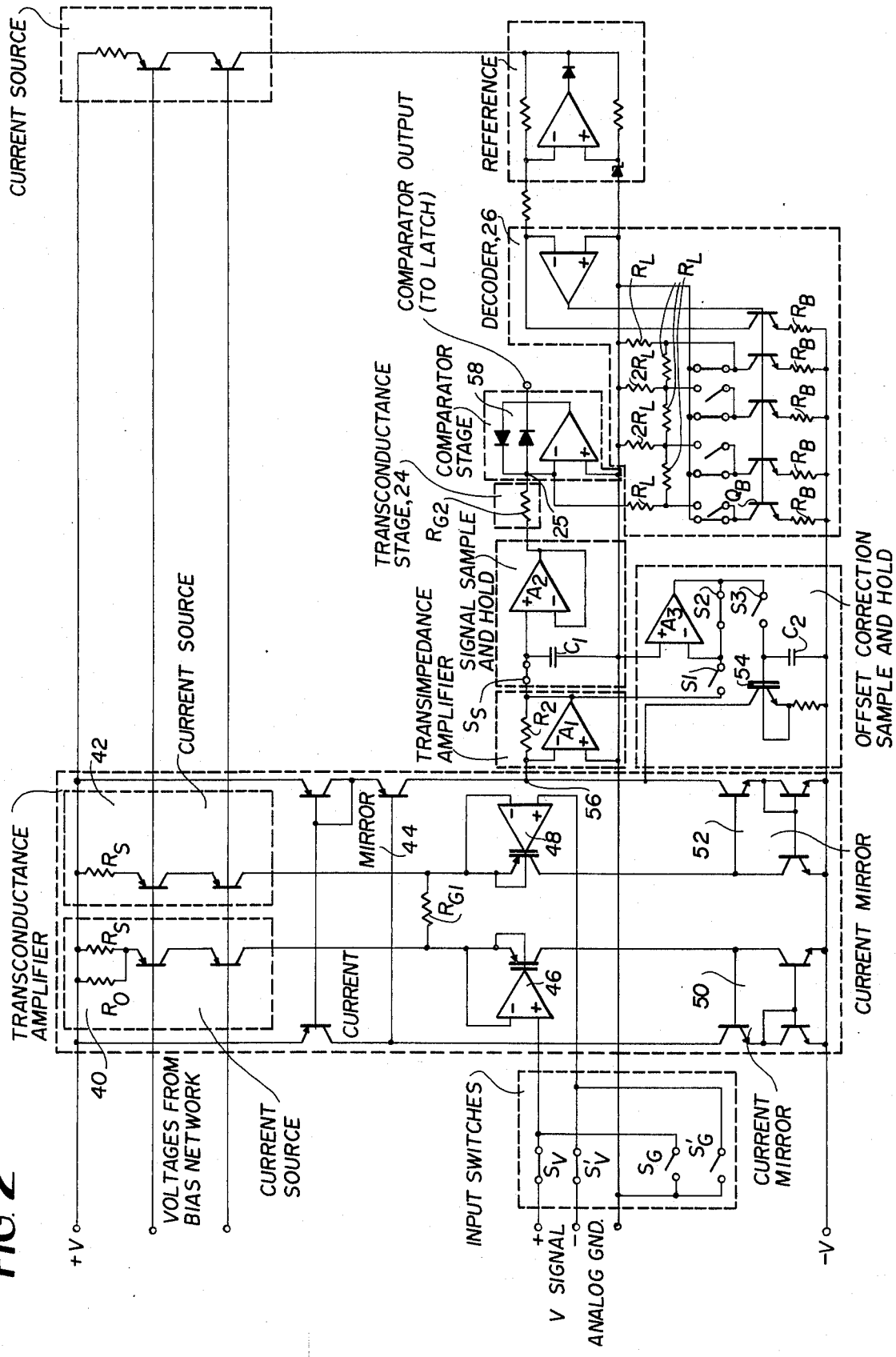
FIG. 2 illustrates conventional circuits which may be used to implement the functional blocks of FIG. 1.

The decoder 108 may be the same as the decoder 26 of FIG. 2. The decoder itself is known and its operation is well known to those skilled in the art.

The operation of the novel encoder of the present invention will now be described. Referencing FIG. 6, which is a switch timing diagram for the encoder of FIGS. 3 and 4, it is seen that an encoding cycle is divided into four periods. Upon the initiation of an encoding cycle, offset adjustment is first effected, followed by a gain adjustment. Thereafter, the input analog signal is sampled and stored. This is following by an encoding period during which time the stored analog signal is successively compared against a balance current generated by the decoder until a match is achieved. Since there is a digital representation of the balance current, there will exist a digital representation of the balance current which matches the input analog signal. This digital signal is read out to complete the encoding cycle.

During the offset correction period, the switches $S_{G2}$ and $S'_{G2}$ are closed, connecting the inputs to the transconductance amplifier 102 to system ground. Simultaneously, the switches $S_{V2}$, $S'_{V2}$, $S_{VS}$, and $S'_{VS}$ are all open, blocking the input analog signal and the standard voltage from the input to the transconductance amplifier. In addition, the comparator non-linear feedback switch S11 is open while the signal and offset sample and hold switch S10 is closed. It should be noticed that during this time period, the gain correction sample and hold switch S12 is held open, rendering the gain correction circuitry inoperative during the offset correction sequence. The switches in the decoder are all set to provide a zero code into the decoder. With the decoder being constructed as illustrated in FIG. 4, the switches are connected in a manner to cause the bias currents to flow directly to the analog ground from the current sources comprised of the resistors $R_B$ and the transistors $Q_B$. With the switches set as just described, any offsets in the system produce an output current at the output of the comparator amplifier A10, which current flows through closed switch S10 into the storage capacitor C10. The capacitor C10 is driven to a voltage which permits the buffer 150 to generate a current into the summing node which equals the offset current out of the summing node. When this occurs, the system is at equilibrium and the sample switch will be opened. The voltage remaining across capacitor C10 after switch S10 has been opened is the offset correction voltage.

Gain correction follows offset correction. During the gain correction sequence, the inputs to the transconductance amplifier 102 are tied to a standard input voltage by closing switches $S_{VS}$ and $S'_{VS}$. Simultaneously, the switches $S_{V2}$, $S'_{V2}$, $S_{G2}$ and $S'_{G2}$ are all opened. The comparator non-linear feedback switch S11 remains open, as does the signal and offset sample and hold switch S10. The gain correction sample and hold switch S12 is closed to electrically connect the gain correction circuit 118 to the output from the comparator amplifier A10. At this point in the cycle, the switches in the decoder 108 are set to provide a full scale output from the decoder when the standard voltage is designated as full scale. If the standard voltage is less than full scale, the switches of the decoder are set to a value which would equal the standard voltage. Current flows from the output of the comparator amplifier A10 to charge the gain correction sample and hold capacitor C11. This current will drive the capacitor C11 to a voltage which permits the buffer device 152 to generate a current into the decoder 108 which will result in an equilibrium balance current being generated at the decoder output to the summing node 104. When the equilibrium point is reached, the switch S12 is open and the gain correction voltage is stored on the capacitor C11.

The signal sampling follows. During the sample and hold interval of the decoding cycle, the switches $S_{V2}$ and S'$_{V2}$ are closed while the switches S$_{VS}$, S'$_{VS}$, S$_{G2}$ and S'$_{G2}$ are all opened. In addition, the non-linear feedback switch S11 remains open as does the gain correction sample and hold switch S12. The signal and offset sample and hold switch S10 is closed to connect the output of the comparator amplifier A10 to the capacitor C10 of the signal and offset sample and hold circuit. Once again, the decoder switches are set to provide a zero code in the decoder. That is, the switches are set so that the decoder bias currents all flow to the analog ground. With the switches so set, the signal sample and hold capacitor C10 is then charged with the current proportional to the current at the summing node 104 which current corresponds to the unknown analog input signal. That is to say, the output of the amplifier A10 drives the holding capacitor C10 to a voltage which permits the buffer 150 to generate a current into the summing node 104 which equals the signal current flowing out of it. The system will then be at equilibrium and the sample switch S10 is opened, leaving the signal stored as a voltage across the capacitor C10, compensated by the offset voltage previously stored across that capacitor.

The encoding period follows. During the encoding sequence, the input switches tie the inputs to the transconductance amplifier 102 to analog ground. This leaves a net current at the summing node equal in magnitude to that produced by the input signal and the transconductance amplifier and of the proper polarity to oppose the current produced by the decoder. The non-linear feedback switch S11 is now closed to reconnect the feedback path around the comparator amplifier A10 and the encoding sequence proceeds. As previously stated herein, the encoding sequence is conventional and does not, per se, form a portion of this invention. For this reason, a further description of the encoding sequence itself will not be set out herein.

It should now be evident that the analog to digital converter of the present invention, by reason of the unique encoder design, is of much simpler construction than the conventional analog to digital converter system. Although of much simpler construction, it possesses the capability to carry out all of the operational features of the standard analog to digital converters. By reason of the encoder design, the requirement for separate instrumentation amplifier and sample and hold circuit have been eliminated in that their functions have been incorporated into the encoder itself. It is to be noted that the detailed circuitry implementing the functional blocks of FIG. 3 are for illustration purposes only and are not intended to limit the scope of the invention and it is to be understood that other circuits may be used without departing from the spirit or scope of the invention.

I claim:

1. In an analog to digital conversion system operating to receive an analog input signal in the form of a differential voltage and convert said input signal into a digital representation thereof, said system performing said conversion over a multi-part cycle by first accomplishing offset correction during the first part of the cycle, converting said differential voltage to a single ended analog signal, sampling said single ended signal and storing said sampled signal during another part of said cycle and subsequently encoding the stored analog signal sample during the final part of the cycle, said system including a transconductance amplifier to convert the differential voltage to a single ended current signal, circuitry for sampling and storing the single ended current signal and circuitry for digitally encoding the stored single ended current signal, the improvement comprising:

an amplifier having at least one input and an output, and feedback means for connecting the amplifier output to said amplifier input, the feedback means including feedback switch means for selectively interrupting the feedback path from the amplifier output to its input, said transconductance amplifier being coupled to said amplifier input, signal sample and hold means for sampling and storing sampled values of the single ended analog input signal, said signal sample and hold means having an input connected to the output of said amplifier and an output connected to an input of said amplifier, said signal sample and hold means including sample and hold switch means for selectively interrupting the connection between the output of the amplifier and the input to the signal sample and hold means, and switch drive logic means for controlling the states of said feedback switch means and said sample and hold switch means during each part of the multi-part encoding cycle such that said feedback switch means interrupts the feedback path in said amplifier and said sample and hold switch means completes the connection between the amplifier output and the sample and hold input when said input signal is to be sampled and stored, and such that said feedback switch means completes the feedback path between said amplifier output and input while said sample and hold switch means operates to complete the connection between said amplifier output and sample and hold means input during the encoding portion of the encoding cycle;

whereby said amplifier operates as a transimpedance device during the signal sample and hold operation and as a comparator during the encoding operation.

2. In an analog to digital conversion system according to claim 1, further including means for correcting offset errors, said offset error correcting means including said sample and hold means, means forming part of said switch drive logic means for controlling the states of said feedback switch means and said sample and hold switch means such that during the offset correction portion of the multi-part encoding cycle the feedback switch means interrupts the feedback path in said amplifier and said sample and hold switch means completes the connection between the amplifier output and the input to the sample and hold means, whereby during offset correction the amplifier operates as a transimpedance device and the sample and hold means as an offset correction circuit.

3. In an analog to digital conversion system according to claim 2, wherein said sample and hold means further includes a voltage storage device for storing the input signal thereto as a voltage and transconductance means connected between said voltage storage device and said amplifier input for converting the stored voltage sample to a current signal.

4. In an analog to digital conversion system according to claim 1, further including gain correction means for establishing and storing a gain correction signal, said gain correction means including a gain correction voltage store connected to the output of said amplifier, gain correction switch means for selectively interrupting the connection between the amplifier output and a gain correction voltage store, a transconductance means for converting the stored gain correction voltage to a current signal and means for controlling the states of said feedback switch means and the gain correction switch means such that during a gain correction period the feedback switch means interrupts the feedback path in the amplifier and the gain correction switch means completes the connection between the amplifier output and the gain correction voltage store.

5. In an analog to digital conversion system according to claim 4, further including offset error correcting means comprising an offset error voltage store connected to the output of said amplifier, an offset error switch means for selectively interrupting the connection between the said amplifier output and said offset error voltage store, and means for controlling the feedback switch means and the offset error switch means such that during the offset correction part of the multi-part encoding cycle said feedback switch means operates to interrupt the feedback path in said amplifier and said offset error switch means operates to complete the connection between the amplifier output and the offset error voltage store.

6. In an analog to digital conversion system according to claim 5, wherein the signal sample and hold means and the offset error correcting means share a common voltage store, switch means and transimpedance device, said transimpedance device connecting the voltage store to the input of said amplifier.

* * * * *